United States Patent
Abdallah et al.

(10) Patent No.: US 8,230,313 B2
(45) Date of Patent: Jul. 24, 2012

(54) LOW-POWER PREDECODING BASED VITERBI DECODING

(75) Inventors: Rami Abdallah, Urbana, IL (US); Seok-Jun Lee, Allen, TX (US); Manish Goel, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 472 days.

(21) Appl. No.: 12/538,631

(22) Filed: Aug. 10, 2009

(65) Prior Publication Data

US 2010/0034325 A1 Feb. 11, 2010

Related U.S. Application Data

(60) Provisional application No. 61/087,772, filed on Aug. 11, 2008.

(51) Int. Cl.
*H03M 13/03* (2006.01)
*H03D 1/00* (2006.01)
*H04L 27/06* (2006.01)

(52) U.S. Cl. ....................... 714/795; 375/341
(58) Field of Classification Search ................... None
See application file for complete search history.

(56) References Cited

U.S. PATENT DOCUMENTS

| | | |
|---|---|---|
| 5,327,441 A | 7/1994 | Kawazoe et al. |
| 5,426,655 A | 6/1995 | Feig |
| 5,805,632 A | 9/1998 | Leger |
| 6,046,691 A | 4/2000 | Aziz et al. |
| 6,130,629 A | 10/2000 | Aziz et al. |
| 6,910,170 B2 | 6/2005 | Choi et al. |
| 6,952,443 B1 | 10/2005 | Kong et al. |
| 7,027,243 B2 | 4/2006 | Mitchell et al. |
| 7,027,245 B2 | 4/2006 | Mitchell et al. |
| 7,164,371 B2 | 1/2007 | Lee et al. |
| 7,167,684 B2 | 1/2007 | Kadous et al. |
| 7,184,713 B2 | 2/2007 | Kadous et al. |
| 7,286,595 B2 | 10/2007 | Cideciyan et al. |
| 2002/0091973 A1 | 7/2002 | Choi et al. |
| 2003/0236080 A1 | 12/2003 | Kadous et al. |
| 2005/0078772 A1 | 4/2005 | Cideciyan et al. |
| 2005/0213238 A1 | 9/2005 | Mitchell et al. |

(Continued)

FOREIGN PATENT DOCUMENTS
GB 2343346 A 5/2000

(Continued)

OTHER PUBLICATIONS

Ghanipour, F.; Nabavi, A.R.; Design of a low-power Viterbi decoder for wireless communications, Dec. 2003, IEEE, vol. 1, pp. 304-307.*
Jing-ling Yang; Wong, A.K.K.; Designing of precomputational-based low-power Viterbi decoder, Jun. 2004, IEEE, vol. 2, pp. 603-606.*

*Primary Examiner* — Guerrier Merant
(74) *Attorney, Agent, or Firm* — Steven A. Shaw; W. James Brady; Frederick J. Telecky, Jr.

(57) ABSTRACT

In at least some disclosed embodiments, a system includes a Viterbi decoder and predecoding logic coupled to the Viterbi decoder. The predecoding logic decodes encoded data. The system further includes detection logic coupled to the predecoding logic. The detection logic tests decoded data, and the detection logic produces a binary result. The Viterbi decoder is enabled if the binary result is a first value, and the Viterbi decoder is disabled if the binary result is a second value.

19 Claims, 2 Drawing Sheets

U.S. PATENT DOCUMENTS

| | | |
|---|---|---|
| 2005/0243456 A1 | 11/2005 | Mitchell et al. |
| 2005/0245197 A1 | 11/2005 | Kadous et al. |
| 2006/0022847 A1 | 2/2006 | Lee et al. |
| 2006/0195498 A1 | 8/2006 | Dobbek et al. |
| 2006/0195775 A1 | 8/2006 | Cideciyan et al. |
| 2006/0221478 A1 | 10/2006 | Galbraith et al. |
| 2007/0094563 A1 | 4/2007 | Kim et al. |
| 2009/0089648 A1 | 4/2009 | Tsui et al. |

FOREIGN PATENT DOCUMENTS

| | | |
|---|---|---|
| WO | 9107720 A1 | 5/1991 |
| WO | 2004001545 A3 | 12/2003 |
| WO | 2008130160 A1 | 10/2008 |
| WO | 2008130169 A1 | 10/2008 |

* cited by examiner

LOW-POWER PREDECODING BASED VITERBI DECODING

CROSS-REFERENCE TO RELATED APPLICATIONS

The present application claims priority to U.S. Ser. No. 61/087,772 filed on Aug. 11, 2008 and entitled "Low-Power Predecoding Based Viterbi Engine," which is herein incorporated by reference.

BACKGROUND

Andrew Viterbi developed a decoding algorithm in the 1960s that is now known as the "Viterbi algorithm." A decoder that implements the Viterbi algorithm is known as a Viterbi decoder. The Viterbi algorithm is used to decode a particular convolutional code using maximum-likelihood concepts, and Viterbi decoders currently are employed in data communications, wired communications, and wireless voice communications to protect information from channel errors. Viterbi decoders, unfortunately, are relatively resource hungry for industries constrained in every consideration by power limitations. Thus, any reduction in the power consumed by Viterbi decoders would be advantageous.

SUMMARY

System and methods for low power Viterbi decoding are described herein. In at least some disclosed embodiments, a system includes a Viterbi decoder and predecoding logic coupled to the Viterbi decoder. The predecoding logic decodes encoded data to be transmitted over noisy channels, which is the function of Viterbi decoder, but the complexity of predecoding logic is much smaller than that of Viterbi decoder. The system further includes detection logic coupled to the predecoding logic. The detection logic tests decoded data from predecoding logic, and the detection logic produces a binary result. Examples of sets of binary results are "0" and "1;" "pass" and "fail;" and "error" and "no error." Then, the Viterbi decoder is enabled only if the binary result is a first value, and the Viterbi decoder is disabled if the binary result is a second value.

In other disclosed embodiments, a method includes a) decoding encoded data; b) testing the decoded data to produce a binary result; c) enabling a Viterbi decoder if the binary result is a first value; and d) disabling the Viterbi decoder if the binary result is a second value.

In yet other disclosed embodiments, a wireless electronic device ("WED") includes a Viterbi decoder and predecoding logic coupled to the Viterbi decoder. The predecoding logic decodes encoded data. The system further includes detection logic coupled to the predecoding logic. The detection logic tests decoded data, and the detection logic produces a binary result. The Viterbi decoder is enabled if the binary result is a first value, and the Viterbi decoder is disabled if the binary result is a second value.

These and other features and advantages will be more clearly understood from the following detailed description taken in conjunction with the accompanying drawings and claims.

BRIEF DESCRIPTION OF THE DRAWINGS

For a more complete understanding of the present disclosure, reference is now made to the accompanying drawings and detailed description, wherein like reference numerals represent like parts.

DETAILED DESCRIPTION

Figure 1:
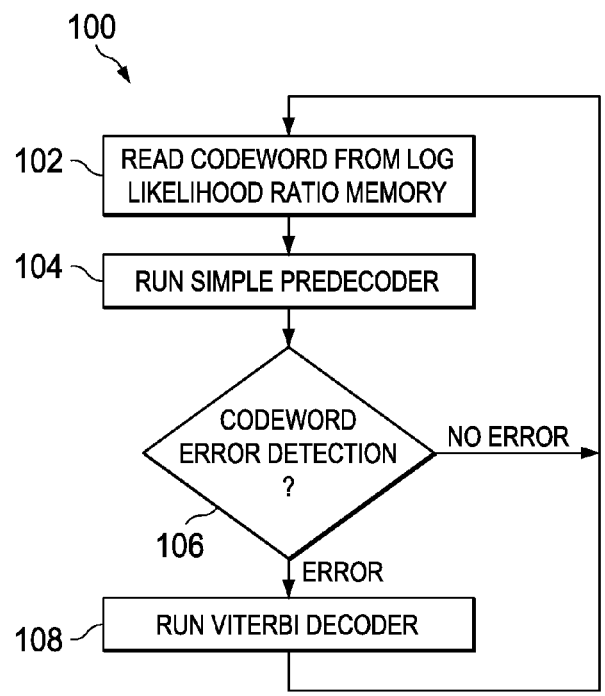
FIG. 1 illustrates a method of low power Viterbi decoding in accordance with at least some illustrative embodiments.

Certain terms are used throughout the following claims and description to refer to particular components. As one skilled in the art will appreciate, different entities may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean an optical, wireless, indirect electrical, or direct electrical connection. Thus, if a first device couples to a second device, that connection may be through an indirect electrical connection via other devices and connections, through a direct optical connection, etc. Additionally, the term "system" refers to a collection of two or more hardware components, and may be used to refer to an electronic device.

The following discussion is directed to various embodiments of the invention. Although one or more of these embodiments may be preferred, the embodiments disclosed should not be interpreted, or otherwise used, as limiting the scope of the disclosure, including the claims, unless otherwise specified. In addition, one having ordinary skill in the art will understand that the following description has broad application, and the discussion of any embodiment is meant only to be exemplary of that embodiment, and not intended to intimate that the scope of the disclosure, including the claims, is limited to that embodiment.

The market for wireless electronic devices ("WEDs") is experiencing tremendous growth along with wireless technology such as LTE (Long-Term-Evolution), WiMAX (Worldwide Interoperability for Microwave Access), 2G/3G cellular wireless system, IEEE802.11 Wireless LAN, DVB-H (Digital Video Broadcasting—Handheld), etc. A WED typically includes a radio receiver or transceiver device coupled to an antenna. Currently, there are several implementations of wireless technology in an electronic device. Examples of wireless technologies include LTE, WiMAX, wireless LAN, and UWB.

LTE, short for Long Term Evolution, is the fourth generation of radio technologies designed to increase the capacity and speed of mobile telephone networks. Because the current generation of mobile telecommunication networks are known as 3G, LTE has been given the name 4G.

WiMAX, short for Worldwide Interoperability for Microwave Access, is a telecommunications technology that provides wireless transmission of data using a variety of transmission modes, from point-to-multipoint links to portable and fully mobile internet access.

A wireless LAN, short for wireless local area network, links two or more computers or devices using spread-spectrum or OFDM, short for orthogonal frequency-division multiplexing, modulation technology to enable communication between devices in a limited area. This gives users the mobility to move around within a broad coverage area and still be connected to the network.

UWB, short for ultra-wideband or ultraband, is a radio technology that can be used at very low energy levels for short-range high-bandwidth communications by using a large portion of the radio spectrum.

DVB-H (Digital Video Broadcasting—Handheld) is one of three prevalent mobile TV formats. It is a technical specification for bringing broadcast services to mobile handsets. DVB-H was formally adopted as ETSI standard EN 302 304 in November 2004.

Terrestrial Digital Multimedia Broadcasting (T-DMB) is a digital radio transmission technology developed by South Korea as part of the national IT project for sending multimedia such as TV, radio and datacasting to mobile devices such as mobile phones. Satellite Digital Multimedia Broadcasting is known as S-DMB.

Devices implementing these and other communication methods operate in power-starved environments. However, by using a predecoder, which consumes 95% less power than the Viterbi decoder because the predecoder is much less complex than the Viterbi decoder, the Viterbi decoder can be disabled resulting in power saving of channel decoding. As such, that power can be diverted elsewhere, or the life of the device can be extended.

Figure 2:
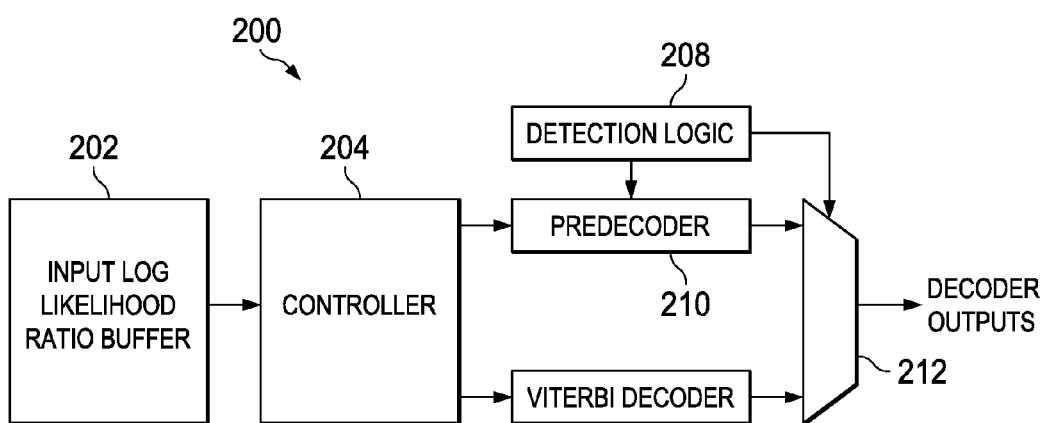
FIG. 2 illustrates a system of low power Viterbi decoding in accordance with at least some illustrative embodiments.

FIG. 1 illustrates a method 100 of low power Viterbi decoding according to at least some embodiments. FIG. 2 illustrates a system 200 of low power Viterbi decoding according to at least some embodiments. Two types of states in which a WED may exist are 1) linking state, when the WED is searching for and entering into communication with the appropriate base station; and 2) steady state, when the WED is in normal operation. The method 100 is preferably performed when the WED is in steady state. Two types of messages sent and received, in the case of LTE or WiMAX mobile wireless systems, between base stations and WEDs are control messages and data messages. Control messages are typically smaller than data messages. The method 100 is preferably performed using control messages in at least one embodiment. In another embodiment, the method 100 is performed using data messages. At 102, a signal is read or input. The signal is preferably a codeword sent wirelessly from a base station to a WED. A codeword is a portion of an encoded signal. The codeword is preferably read from log likelihood ratio ("LLR") input buffer 202 of the WED, and the codeword ("data") is preferably a portion of a message encoded with a convolutional code. A controller 204 preferably controls data movement through the system 200. At 104, the data is decoded. Preferably, the data is not decoded by the Viterbi decoder 206 at this stage, but by a much simpler "predecoder" 210. The Viterbi decoder 206 is logic configured to implement the Viterbi algorithm. The predecoder 210 preferably comprises predecoding logic coupled to the Viterbi decoder, and can decode encoded data. A brief discussion on decoding will be helpful.

Communication technology involves a transmitter sending a signal to a receiver. Such a signal may be sent over wires or wireless channels. The received signal may not be the same as the transmitted signal due to various factors, e.g., noise. The term "decoding," as used in the communication context, refers to using the received signal to estimate which transmit signal, out of multiple possible transmit signals, was transmitted. The Viterbi algorithm is an efficient procedure for solving maximum likelihood sequence estimation (MLSE) problems such as decoding of convolutional codes. The Viterbi algorithm estimates the most likely sequence of encoder states transitions given the received noisy samples. Considering a mapping of all the possibly transmitted signals onto a coordinate system, a similarly mapped received signal will not be located exactly on the transmitted signal, as expected, due to the factors mentioned above. Rather, the received signal may be in between the possibly transmitted signals, closer to some, and further from others. Decoders using maximum likelihood techniques employ the assumption that the further away the received signal is from a particular possibly transmitted signal on the mapping, the less likely the particular possibly transmitted signal is the transmitted signal. Accordingly, the closer the received signal is to a particular possibly transmitted signal, the more likely the particular possibly transmitted signal is the transmitted signal.

Figure 3:
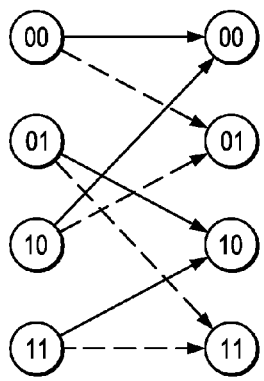
FIG. 3 illustrates a state transition diagram in accordance with at least some illustrative embodiments.
Figure 4:
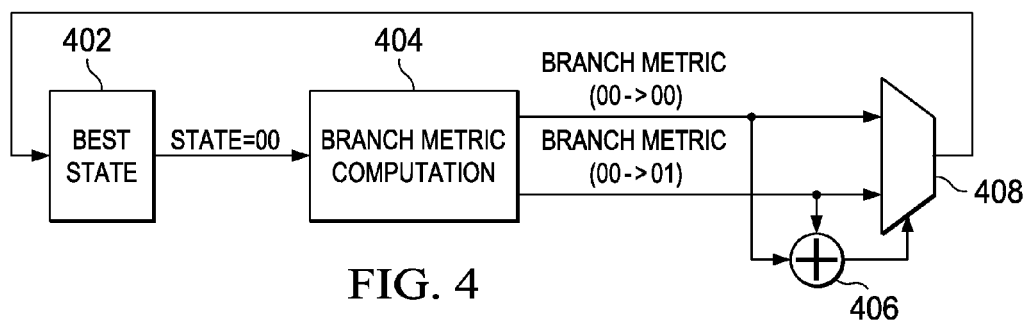
FIG. 4 illustrates a predecoder in accordance with at least some illustrative embodiments.

Turning for a moment to FIGS. 3 and 4, decoding the data includes calculating branch metrics using a state transition table based on the coding scheme used. FIG. 3 illustrates a state transition table for a convolutional code constraint length of 3, and FIG. 4 illustrates the predecoder 210. For each of the four possible states in the left column of FIG. 3, the resultant state is given in the right column if the input bit is 0 (solid arrow) or 1 (dashed arrow). Each transition is associated with cost or "branch metric," and searching for the transition with the maximum likelihood of occurring comprises comparing each branch metric. Specifically, the lowest branch metric (or highest depending on the cost calculation) is the most likely the transition that occurred because a low branch metric indicates that the received signal is close to a particular possibly transmitted signal. For example the coding scheme mandates that, from the state 00, the resultant states can only be 00 or 01 if the input bit is 0 or 1 respectively. The branch metric computation unit 404 comprises logic that determines the branch metrics associated with each transition. The comparator 406 comprises logic that determines which branch metric is lower, and the selector 408 comprises logic that determines the resultant state based on the comparator determination. The resultant state is the newly determined "best state," and the best state value is updated in memory logic 402. Repeating the process for every bit of the encoded data results in decoded data. Thus, decoding data comprises determination of the initial best state and decoding the encoded data bit-by-bit or symbol-by-symbol based on the initial best state. At times, the initial best state is known because each codeword begins at a particular time and with a particular initial state. Otherwise, the initial best state can be determined via trace-back decoding and/or tail biting methods. In at least one embodiment, the predecoder is a "hard decision" predecoder, i.e., using a bit stream as input and Hamming distances for branch metrics.

Returning to FIGS. 1 and 2, at 106, the data decoded by predecoder logic is tested, preferably producing a binary result. Examples of sets of binary results are "0" and "1;" "pass" and "fail;" and "error" and "no error." Detection logic 208 preferably tests the decoded data, and is coupled to the predecoder 210. In at least one embodiment, the two possible polarities of the binary result are 1) Error in the data and 2) No error in the data. Three tests that detect errors in the decoded data are 1) tail-byte property test; 2) branch metric reliability test; and 3) branch metric difference test. The three tests used in any permutation and combination are within the scope of this disclosure as well as other tests of different types. For example, any of the tests may be used alone. As another example, two of the tests may be used in combination or succession in any order. As another example, all three tests may be used in combination or succession in any order. As another example, if all three tests indicate no error in the decoded data, the Viterbi decoder 206 is disabled, but if any test indicates error in the decoded data, the Viterbi decoder 206 is enabled.

The tail byte-property test comprises comparing two sets of bits of the decoded data for identity. For example, if the last K-1 (K being the constraint length in a convolutional code) bits of the decoded data are not identical to the same number of first bits, the result is error in the decoded data.

A trellis is a sideways tree diagram used to represent different possible encoder states at different times. The individual branches of the trellis are associated with branch metrics, and paths through the trellis, comprising branch metrics, are associated with path metrics. The path metric is inversely proportional to the log likelihood probability of the path with which it is associated in at least one embodiment. The Viterbi algorithm recursively finds the path with the minimum path metric for each state. The branch metric reliability test comprises determining a number of trellis sections having a branch metric value above a first threshold, and determining if the number is greater than or equal to a second threshold. For example if the first threshold is 20 and the second threshold is 4, then an error result will occur if 4 or more trellis sections have a branch metric of above 20. Such a result suggests that the predecoder logic output has a higher probability of error than desired. Depending on the calculation, the thresholds may be floors rather than ceilings, e.g., 4 or less trellis sections have a branch metric of below 20. The value of the thresholds are adjustable as necessary.

The branch metric difference test comprises determining if a difference between two best branch metrics at a trellis section is less than a first threshold for at least a second threshold of trellis sections. For example, if the first threshold is 12 and the second threshold is 7, then an error result will occur if the difference between the lowest branch metric and the second lowest branch metric is less than 12 in at least 7 trellis sections. Such a result also suggests that the predecoder logic output has a higher probability of error than desired. Depending on the calculation, the thresholds may be ceilings rather than floors. Selector 212 comprises logic configured to determine the appropriate output based on the tests.

At 108, if the result of the test or tests is that there is an error in the decoded data, the Viterbi decoder is enabled. If the data was a portion of an entire message, the untested portions of the message are preferably not tested. In at least some embodiments, enabling the Viterbi decoder 206 comprises discontinuing testing of data, powering on the Viterbi decoder, and/or using the Viterbi decoder to decode the encoded data.

If the result of the test or tests is that there is no error in the decoded data, the Viterbi decoder is disabled resulting in power savings. If, as depicted in FIG. 1, the Viterbi decoder is already disabled, the method 100 repeats decoding, testing, and conditional enabling or conditional disabling based on the next data, preferably the next codeword. The repeating will continue as long as errors are not detected until an entire message is decoded successfully. In at least one embodiment, disabling the Viterbi decoder comprises not using the Viterbi decoder to decode the encoded data. Preferably, not using the Viterbi decoder comprises reducing power to the Viterbi decoder.

Figure 5:
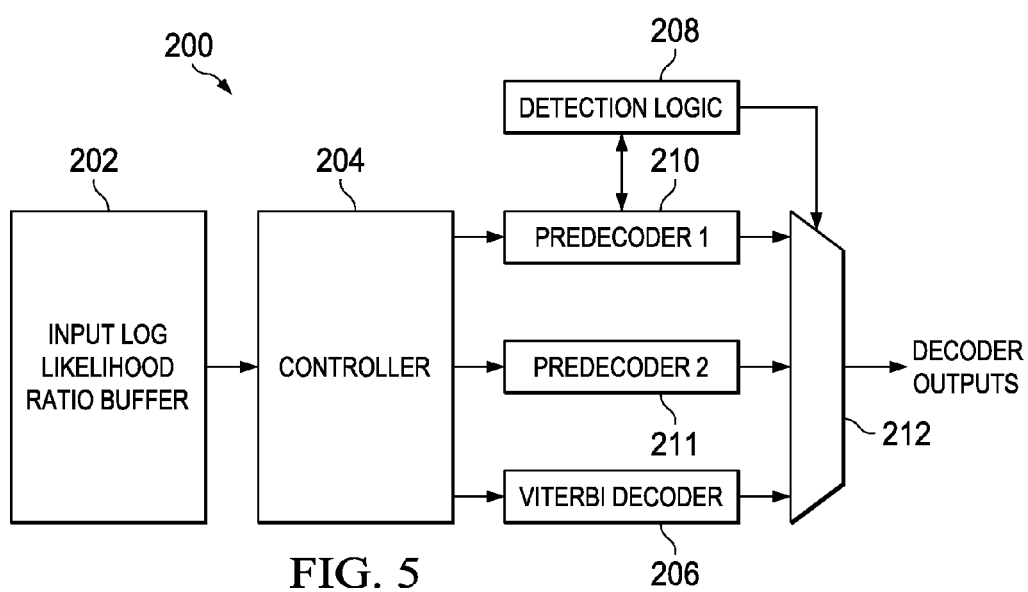
FIG. 5 illustrates a system of low power Viterbi decoding in accordance with at least some illustrative embodiments.

FIG. 5 illustrates an embodiment of the system 200 comprising multiple predecoders 210, 211. The first predecoder 210 decodes the encoded data forward in time across a trellis (usually left to right), and the second predecoder 211 decodes the encoded data backward in time across the trellis (usually right to left). Preferably, the detection logic 208 tests the decoded data from the first predecoder 210, and if the result is in error, the detection logic 208 tests the decoded data from the second predecoder 211. Only if the results of testing decoded data from both predecoders 210, 211 indicate there is an error in the data will the Viterbi decoder 206 be enabled. Therefore, the Viterbi decoder will be disabled more often than the case when using a single predecoder. Combinations and permutations of concurrent and successive testing, including use of more than two predecoders, are within the scope of this disclosure.

The system 200 and/or method 100 is preferably implemented in a wireless electronic device ("WED") such as a cellular phone, desktop computer, notebook computer, handheld computer, calculator, e-book reader, satellite, modem, or personal digital assistant. These WEDs use communication standards such as LTE, WiMAX, Wireless LAN, and UWB, and the system 200 and/or method 100 is compatible with each along with any other standard deploying a convolutional code for message protection from a noisy channel.

Using the systems and methods described herein, the bit error rate is comparable to that of using only a Viterbi decoder, as is the codeword error rate. The power consumption is much saved. A Viterbi decoder may use up to 11.9 mW in normal operation in one possible implementation. The system described in the instant disclosure uses only 0.0179 mW because the Viterbi decoder is disabled in most of the operating time. Other conditions and combinations of conditions will become apparent to those skilled in the art, including the combination of the conditions described above, and all such conditions and combinations are within the scope of the present disclosure. Additionally, audio or visual alerts may be triggered upon successful completion of any action described herein, upon unsuccessful actions described herein, and upon errors.

The above disclosure is meant to be illustrative of the principles and various embodiment of the present invention. Numerous variations and modifications will become apparent to those skilled in the art once the above disclosure is fully appreciated. Also, the order of the actions shown in FIG. 1 can be varied from order shown, and two or more of the actions may be performed concurrently. It is intended that the following claims be interpreted to embrace all variations and modifications.

We claim:

1. A system, comprising:
    a Viterbi decoder;
    a predecoding logic coupled to the Viterbi decoder, the predecoding logic decodes encoded data; and
    a second predecoding logic coupled to the Viterbi decoder, the second predecoding logic decodes encoded data;
    a detection logic coupled to the predecoding logics, the detection logic tests decoded data from the predecoding logic thereby producing a binary result; if the binary result is in error, the detection logic tests decoded data from the second predecoding logic thereby producing a second binary result;
    a controller coupled to the Viterbi decoder, the controller enables the Viterbi decoder if the binary results from both predeconding logics indicate there is an error and disables the Viterbi decoder if either one or both results are not in error.

2. The system of claim 1,
    wherein the detection logic tests the decoded data via a plurality of tests resulting in a plurality of binary results;
    wherein the controller enables the Viterbi decoder if any of the binary results are the first value; and
    wherein the controller disables the Viterbi decoder if all of the binary results are the second value.

3. The system of claim 1, wherein the detection logic compares two sets of bits of the decoded data for identity.

4. The system of claim 1,
wherein the detection logic determines a number of trellis sections having a branch metric value above a first threshold; and
wherein the detection logic determines if the number is greater than or equal to a second threshold.

5. The system of claim 1, wherein the detection logic determines if a difference between two best branch metrics at a trellis section is less than a first threshold for at least a second threshold of trellis sections.

6. The system of claim 1,
wherein the Viterbi decoder decodes the encoded data if enabled; and
wherein the Viterbi decoder does not decode the encoded data if disabled.

7. The system of claim 6, wherein the controller powers down the Viterbi decoder if not decoding the encoded data.

8. The system of claim 1, the predecoding logic decodes the encoded data forward across a trellis, the second predecoding logic decodes the encoded data backward across the trellis.

9. The system of claim 1, further comprising a wireless electronic device ("WED") wherein the WED is selected from the group consisting of cellular phone, desktop computer, notebook computer, handheld computer, calculator, e-book reader, satellite, modem, and personal digital assistant.

10. The system of claim 9, wherein the WED uses a communication standard deploying a convolutional code for message protection from a noisy channel.

11. A method, comprising:
a) decoding encoded data using two predecoders;
b) testing the decoded data from a first predecoder to produce a first binary result;
c) testing the decoded data from a second predecoder, if the first binary result is in error, to produce a second binary result;
d) enabling a Viterbi decoder when the binary results from both predeconding logics indicate there is an error; and
e) disabling the Viterbi decoder when either one or both binary results are not in error.

12. The method of claim 11, testing the decoded data comprising comparing two sets of bits of the decoded data for identity.

13. The method of claim 11, testing the decoded data comprising
determining a number of trellis sections having a branch metric value above a first threshold; and
determining if the number is greater than or equal to a second threshold.

14. The method of claim 11, testing the decoded data comprising determining if a difference between two best branch metrics at a trellis section is less than a first threshold for at least a second threshold of trellis sections.

15. The method of claim 11,
enabling the Viterbi decoder comprising using the Viterbi decoder to decode the encoded data;
disabling the Viterbi decoder comprising not using the Viterbi decoder to decode the encoded data.

16. The method of claim 15,
not using the Viterbi decoder comprising reducing power to the Viterbi decoder.

17. The method of claim 11, repeating a), b), c), d), and e) until the Viterbi decoder is enabled or an entire message is tested.

18. The method of claim 17, decoding encoded data comprising
determining a best state; and
decoding the encoded data symbol-by-symbol based on the best state.

19. A system, comprising:
a Viterbi decoder;
a predecoding logic coupled to the Viterbi decoder, the predecoding logic decodes encoded data;
a second predecoding logic coupled to the Viterbi decoder, the second predecoding logic decodes encoded data;
a detection logic coupled to the predecoding logics, the detection logic tests decoded data from the predecoding logic thereby producing a binary result; if the binary result is in error, the detection logic tests decoded data from the second predecoding logic thereby producing a second binary result; and
a controller coupled to the Viterbi decoder, the controller powers the Viterbi decoder if the binary results from both predeconding logics and powers down the Viterbi decoder if either of the binary results are not in error;
wherein the controller powers down the Viterbi decoder if the Viterbi decoder does not decode the encoded data.

* * * * *